United States Patent [19]

Kipnis

[11] Patent Number: 4,688,005

[45] Date of Patent: Aug. 18, 1987

[54] SELF-OSCILLATING MIXER WITH DARLINGTON TRANSISTORS

[75] Inventor: Issy Kipnis, San Mateo, Calif.

[73] Assignee: Avantek, Inc., Santa Clara, Calif.

[21] Appl. No.: 846,756

[22] Filed: Apr. 1, 1986

[51] Int. Cl.[4] .......................... H03B 5/00; H03B 5/18
[52] U.S. Cl. ................................ 331/117 R; 331/37; 331/117 D; 455/318
[58] Field of Search .......... 331/37, 96, 117 R, 117 D; 455/318, 323, 325, 333

[56] References Cited

U.S. PATENT DOCUMENTS

| | | | |
|---|---|---|---|
| 3,374,445 | 3/1968 | Gaunt, Jr. | 331/117 |
| 3,710,275 | 1/1973 | Tanaka et al. | 331/37 |
| 4,219,779 | 8/1980 | Shinkawa et al. | 455/333 X |
| 4,605,909 | 8/1986 | Tsironis | 331/117 D X |

OTHER PUBLICATIONS

Y. Tajima, "GaAs FET Applications for Injection-Locked Oscillators and Self-Oscillating Mixers", IEEE Transactions on Microwave Theory & Techniques, vol. MTT-27, No. 7, Jul. 1979.

C. Tsironis, "12 GHz Receiver with a Self-Oscillating Dual Gate MESFET Mixer", ACTA Electronica, 4/23/80, pp. 325-329.

Electronics Designers Handbook, L. J. Giacoletto, Ed., McGraw-Hill 1977; pp. 22-18, 22-19.

Primary Examiner—Eugene R. LaRoche
Assistant Examiner—David Mis
Attorney, Agent, or Firm—Limbach, Limbach & Sutton

[57] ABSTRACT

A self-oscillating mixer is disclosed, and includes two bipolar transistors coupled as a Darlington pair, where the base of the first transistor receives an input signal, and where the common collectors of the transistors generate an output signal; and a feedback resonator operable for coupling signals at the local-oscillator frequency from the output side of the transistors to the input side of the transistors. Such a self-oscillating mixer can provide signal conversion gain at microwave frequencies.

18 Claims, 2 Drawing Figures

SELF-OSCILLATING MIXER WITH DARLINGTON TRANSISTORS

BACKGROUND OF THE INVENTION

1. Field of the Invention

This invention relates generally to frequency converters, and relates more particularly to a self-oscillating mixer with Darlington-connected transistors and a feedback resonator.

2. Description of the Relevant Art

Frequency converters are used to change the frequency of a signal to a different frequency, without loss of the information contained in the signal. They are often used in communications and radar systems, wherein, for example, a received signal is down-converted to a lower frequency for amplification, filtering, and other signal processing.

Frequency converters typically consist of a local oscillator, which generates a signal at a reference frequency, and a mixer, which combines an input signal and the local-oscillator signal to generate an output signal. The output signal contains the frequency products of the input and local-oscillator signals, which are the sums and differences of the input and local-oscillator signals and multiples thereof. Most commonly, a down conversion is desired, in which case the frequency product equal to the difference between the local-oscillator frequency and the input frequency is allowed to pass through a band-pass filter, and the other frequency products are filtered out.

Some mixers used in frequency converters are passive devices, such as diode mixers, which may utilize, for example, one or several diodes. Since diode mixers are passive devices, no dc current is required to power them. The local-oscillator signal provides the power, but at a cost that may be greater than if dc current powered the diode mixer. Also since diode mixers are passive devices, there is a loss in signal strength through the mixer, so that the output signal is weaker than the input signal. Most frequency converters using diode mixers require a separate local-oscillator device to generate the local-oscillator signal.

Other mixers used in frequency converters are active devices using transistors to provide some signal gain. At microwave frequencies, active mixers usually are designed around gallium arsenide field-effect transistors. Frequency converters using these active mixers also require a separate local-oscillator device to generate the local-oscillator signal.

One type of frequency converter, known as a self-oscillating mixer, does not require a separate local-oscillator device because the self-oscillating mixer generates its own local-oscillator signal. Self-oscillating mixers are two port devices, input and output, in contrast to the three port mixers described above, which have a local-oscillator port in addition to their input and output ports. Single bipolar transistors have been used in self-oscillating mixers operating in the radio frequency range. However, self-oscillating mixers using single bipolar transistors do not operate acceptably at the upper range of microwave frequencies because of low input impedance, which causes signal reflections, and because of low gain at the high frequencies. In addition, single transistor self-oscillating mixers suffer from the disadvantage that one degree of design freedom is lost due to the combining of the mixer and local-oscillator devices.

For frequency conversion at microwave frequencies, self-oscillating mixers fabricated from gallium arsenide field-effect transistors have been used, including both single and dual gate devices. One disadvantage to such mixers is the expense of gallium arsenide devices.

SUMMARY OF THE INVENTION

In accordance with the illustrated preferred embodiment, the present invention provides a self-oscillating mixer with Darlington-connected transistors and a feedback resonator. The self-oscillating mixer receives an input signal and, in response, generates an output signal containing the frequency products of the input signal and a local-oscillator signal. The self-oscillating mixer includes two bipolar transistors coupled as a Darlington pair, where the base of the first transistor receives the input signal, and where the common collectors of the transistors generate the output signal; and a feedback loop operable for coupling signals at the local-oscillator frequency from the output side of the transistors to the input side of the transistors.

The Darlington-connected transistors perform three functions: mixing, amplifying, and oscillating. The transistors mix the input and local-oscillator signal and amplify the resulting output signal. The transistors, in combination with the feedback loop, oscillate at the local-oscillator frequency. The first transistor limits the amplitude of the oscillations and generates the frequency products, while the second transistor acts as an amplifier. Since the two transistors are separately biased, the performance of each transistor can be separately optimized.

The feedback loop includes a resonator that determines the local-oscillator frequency. Preferably, although not necessarily, the resonator is a dielectric resonator that couples a portion of the output signal from the transistors, at the resonant frequency of the resonator, back to the input side of the transistors.

The self-oscillating mixer of the present invention provides several advantages over prior art self-oscillating mixers and frequency converters. One advantage is the relatively high input impedance that allows the mixer to be used with a fairly broad band of input frequencies. Another advantage is the high gain of the Darlington-connected transistors, which extends the upper frequency limit of operation of the self-oscillating mixer. A further advantage is relatively low cost, which results from the combination of the mixing, amplifying, and oscillating functions into a single device, and from the use of silicon, rather than gallium arsenide, transistors. An important feature of the self-oscillating mixer of the present invention is its ability to handle input and local-oscillator frequencies in excess of 10 GHz.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter. For example, the term "input signal" is used as equivalent to the commonly used term "RF input" for identifying a signal to be frequency shifted, and the term "output signal" is used as equivalent to the commonly used term "intermediate signal" for identifying the resultant signal.

DETAILED DESCRIPTION OF THE PREFERRED EMBODIMENT

Figure 1:
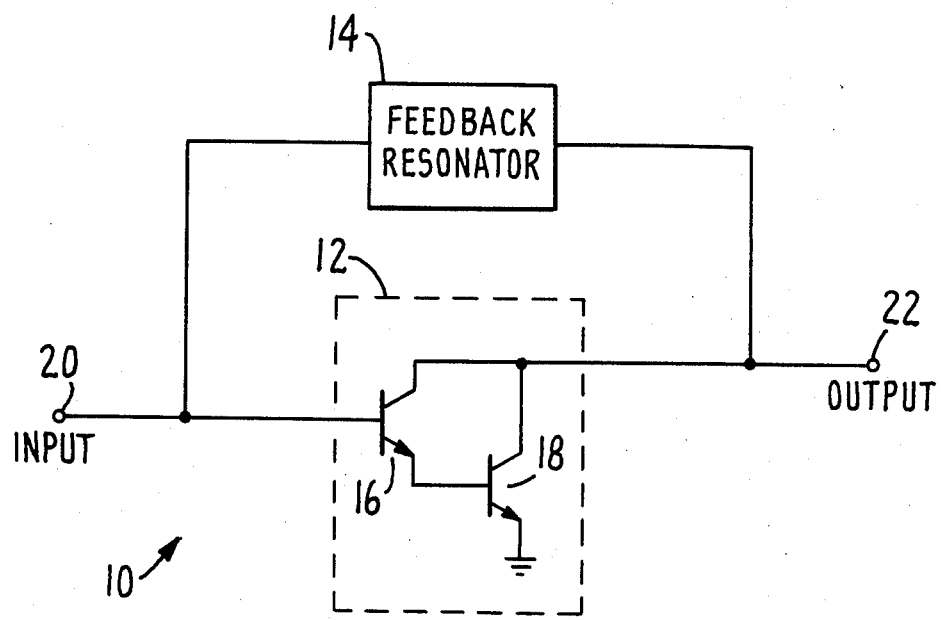
FIG. 1 is a block diagram of a self-oscillating mixer according to the present invention.
Figure 2:
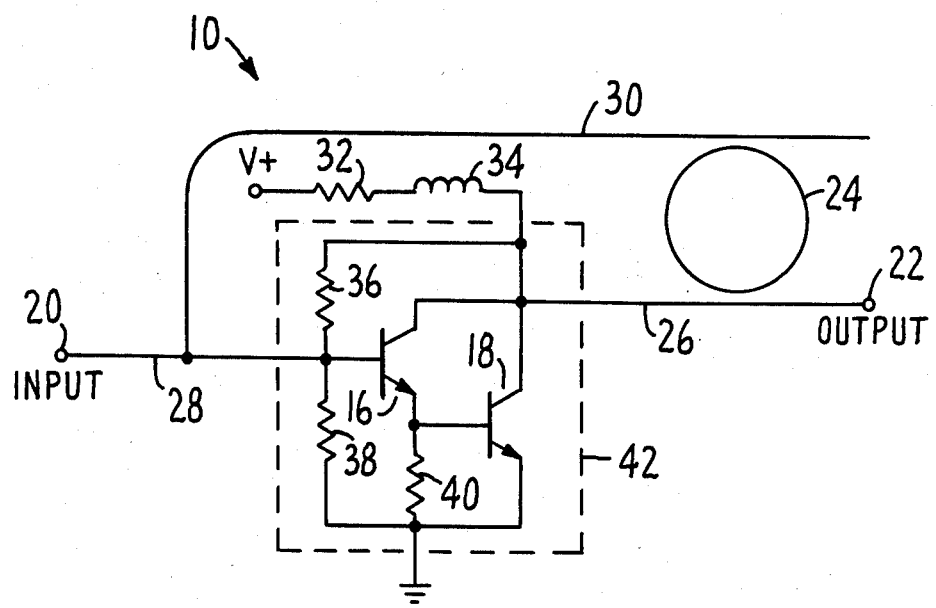
FIG. 2 is a schematic circuit diagram of the preferred embodiment of the self-oscillating mixer of FIG. 1.

FIGS. 1 and 2 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

As shown in FIG. 1, the preferred embodiment of the present invention is a self-oscillating mixer 10 with Darlington-connected transistors 12 and a feedback resonator 14. The Darlington-connected transistors 12 consist of two bipolar transistors 16 and 18, with the emitter of the first transistor 16 connected to the base of the second transistor 18. The base of the first transistor 16 is coupled to an input port 20, and the collectors of the two transistors 16 and 18 are connected in common to an output port 22. A signal to be frequency shifted is supplied to the input port 20, while the resulting output signal is available at the output port 22.

The feedback resonator 14 is coupled between the output side and the input side of the Darlington-connected transistors 12. The feedback resonator 14 forms a feedback loop that selectively feeds back to the base of the first transistor 16 a signal having a substantially constant frequency, i.e., the local-oscillator frequency, which is substantially equal to the resonant frequency of the feedback resonator 14. Once the mixer 10 is powered on, the feedback resonator 14 picks up a portion of the output signal from the transistors 12, and supplies to the base of transistor 16 a signal at the resonant frequency of the feedback resonator. This signal is circulated through the feedback resonator 14 and transistors 12, where it is continuously amplified by the transistors and filtered by the feedback resonator.

Although the feedback resonator 14 can be any of a wide range of resonant devices, preferably the feedback resonator is a dielectric resonator 24, as shown in FIG. 2. The dielectric resonator 24 is fixed to a circuit board that carries several micro-strip lines, including a micro-strip line 26 from the common collectors of the transistors 12 to the output port 22, a micro-strip line 28 from the input port 20 to the base of the first transistor 16, and a micro-strip line 30 from the dielectric resonator to the micro-strip line 28. The dielectric resonator 24 is positioned adjacent to and between the micro-strip lines 26 and 30. The size and dielectric constant of the dielectric resonator 24 determines its resonant frequency, while the relative spacing between the dielectric resonator and the adjacent micro-strip lines 26 and 30 determine the amount of coupling through the dielectric resonator 24 between micro-strip line 26 and micro-strip line 30. The end of the micro-strip line 30 that extends past the dielectric resonator 24 may be terminated through a resistor to ground, although it need not be so terminated. As an alternative feedback resonator, a resonant circuit with a varactor and inductor can be used to provide a tunable local-oscillator frequency. Also alternatively, a surface acoustic wave resonator could be utilized as the resonant element.

The self-oscillating mixer 10 is powered by a source of direct current. As shown in FIG. 2, the preferred embodiment of the mixer 10 is powered by a source of positive voltage, V+, which is supplied to the common collectors of the transistors 12 through a resistor 32 and an inductor 34. The transistors 16 and 18 are biased by resistors 36, 38, and 40. Resistors 36 and 38 are coupled between the common collectors and ground, while resistor 40 is coupled between ground and the common connection between the emitter of transistor 16 and base of transistor 18. These separate biasing resistors provide biasing means for separately biasing the two transistors 16 and 18, so that the performance of each transistor can be independently adjusted. Preferably, the Darlington-connected transistors 12 and their bias circuitry are fabricated as a monolithic integrated circuit 42. Also preferably, the transistors 16 and 18 are NPN bipolar transistors fabricated in silicon. Such devices are available, for example, from Avantek, Inc. of Santa Clara, Calif.

In operation, an input signal supplied to the input port 20 is mixed with the output of the feedback resonator 14 by the first transistor 16. The first transistor 16 forms the frequency products of the two signals, and the second transistor 18 amplifies those frequency products. The frequency products occur at frequencies equal to the sums and differences of the frequencies of the input signal, the local-oscillator signal, and their multiples.

The Darlington-connected transistors 12 of the mixer 10 permit operation at higher frequencies than does a single bipolar transistor device. There are at least two reasons for this, one of which is that the mixer 10 has a higher input impedance at high frequencies due to the series connection of the two transistors 16 and 18. Another reason is that the Darlington-connected transistors 12 provide a relatively higher current or power gain than single transistor devices, so that any gain limiting conditions of operation are reached at higher frequencies.

The maximum local-oscillator frequency of the self-oscillating mixer 10 is a function of the gain of the transistors 12 and the losses of the feedback resonator 14. In order for the mixer 10 to self oscillate, the open loop gain of the mixer must be not less than unity, where the open loop gain is the current gain of the transistors 12 times the current loss of the feedback resonator 14. If the open loop gain falls below unity, the local-oscillator signal will stop circulating through the loop formed by the transistors 12 and the feedback resonator 14. The current gain of the transistors 12 is, therefore, a determining factor of the maximum local-oscillator frequency. It has been found that the maximum local-oscillator frequency is approximately equal to the cut-off frequency of the transistors 12. High performance NPN transistors having high cut-off frequencies of about 10 GHz have been successfully used in a self-oscillating mixer 10 to provide a maximum local-oscillator frequency of about 10 GHz. While PNP transistors can also be used as the Darlington-connected transistors 12, at the present time NPN transistors typically have higher cut-off frequencies than do PNP transistors, and for that reason, NPN transistors are preferred.

Although the local-oscillator frequency is limited by the gain of the transistors 12, the input signal is not so strictly limited. However, at very high input signal frequencies, the output signal is down in signal strength because the transistors can not amplify at those frequencies. At the lower limit, the frequencies of the local-oscillator and input signals can approach dc.

A self-oscillating mixer 10 has been built to the following specifications: Avantek MSA-0870 silicon bipolar MMIC amplifier used for the Darlington-connected transistors 12 and bias circuit; local-oscillator frequency=5.15 GHz provided by a dielectric resonator; and input (RF) frequency=4.0 GHz. This device provided 8 dB of conversion gain for the resulting 1.15 GHz output signal.

From the above description, it will be apparent that the invention disclosed herein provides a novel and advantageous self-oscillating mixer with Darlington-connected transistors and a feedback resonator. The foregoing discussion discloses and describes merely exemplary methods and embodiments of the present invention. As will be understood by those familiar with the art, the invention may be embodied in other specific forms without departing from the spirit or essential characteristics thereof. For example, silicon PNP bipolar transistors or gallium arsenide bipolar transistors can be substituted for the preferred silicon NPN bipolar transistors 16 and 18. Also, the resonant device need not be a dielectric resonator. Accordingly, the disclosure of the present invention is intended to be illustrative, but not limiting, of the scope of the invention, which is set forth in the following claims.

What is claimed is:

1. A self-oscillating mixer for receiving an input signal and for generating an output signal containing the frequency products of the input signal and a local-oscillator signal, said self-oscillating mixer comprising:
    an input port for receiving the input signal;
    an output port for supplying the output signal;
    first and second bipolar transistors coupled as a Darlington pair, wherein the base of said first transistor is coupled to said input port, and wherein the common collectors of said transistors are coupled to said output port; and
    a feedback loop operable for coupling signals at the local-oscillator frequency from said common collectors to said base of said first transistor.

2. A self-oscillating mixer as recited in claim 1 wherein said feedback loop includes a resonator coupled between said base of said first transistor and said common collectors, and wherein the resonant frequency of said resonator determines the local-oscillator frequency of said mixer.

3. A self-oscillating mixer as recited in claim 1 wherein said feedback loop includes a dielectric resonator that couples signals at the local-oscillator frequency from a microstrip line connected between said common collectors and said output port to another microstrip line connected to said base of said first transistor.

4. A self-oscillating mixer as recited in claim 1 wherein said first and second bipolar transistors comprise NPN transistors.

5. A self-oscillating mixer as recited in claim 1 further comprising biasing means for biasing said transistors.

6. A self-oscillating mixer as recited in claim 5 wherein said transistors and said biasing means are fabricated as a monolithic integrated circuit.

7. A self-oscillating mixer as recited in claim 5 wherein said biasing means is operable for separately biasing said first and second transistors.

8. A self-oscillating mixer for receiving an input signal and for generating an output signal containing the frequency products of the input signal and a local-oscillator signal, said self-oscillating mixer comprising:
    an input port for receiving the input signal;
    an output port for supplying the output signal;
    first and second NPN transistors coupled as a Darlington pair, wherein the base of said first transistor is coupled to said input port, and wherein the common collectors of said transistors are coupled to said output port;
    means for biasing said transistors; and
    a feedback loop operable for coupling signals at the local-oscillator frequency from said common collectors to said base of said first transistor, wherein said feedback loop includes a dielectric resonator that couples signals at the local-oscillator frequency from a microstrip line connected between said common collectors and said output port to another microstrip line connected to said base of said first transistor, and wherein the resonant frequency of said dielectric resonator determines the local-oscillator frequency of said mixer.

9. A frequency converter comprising:
    mixing means for receiving an input signal and a local-oscillator signal and for generating an output signal containing the frequency products of the local-oscillator and input signals, wherein said mixing means includes first and second bipolar transistors coupled as a Darlington pair, wherein the base of said first transistor is coupled to receive the input and local-oscillator signals, and wherein the common collectors of said transistors are coupled to generate the output signal; and
    local-oscillator means for supplying the local-oscillator signal to said mixing means.

10. A frequency converter as recited in claim 9 wherein said local-oscillator means includes a feedback loop with a resonator coupled between said common collectors and said base of said first transistor, wherein said local-oscillator signal has a substantially constant frequency equal to the resonant frequency of said resonator.

11. A frequency converter as recited in claim 9 wherein said local-oscillator means includes a feedback loop that is operable for coupling signals at the local-oscillator frequency from said common collectors to said base of said first transistor.

12. A frequency converter as recited in claim 11 wherein said feedback loop includes a resonator coupled between said common collectors and said base of said first transistor, and wherein the resonant frequency of said resonator determines the local-oscillator frequency of said mixer.

13. A frequency converter as recited in claim 11 wherein said feedback loop includes a dielectric resonator that couples signals at the local-oscillator frequency from a microstrip line connected to said common collectors to another microstrip line connected to said base of said first transistor.

14. A frequency converter as recited in claim 9 wherein said first and second bipolar transistors comprise NPN transistors.

15. A frequency converter as recited in claim 9 wherein said mixing means further includes biasing means for biasing said transistors.

16. A frequency converter as recited in claim 15 wherein said transistors and said biasing means are fabricated as a monolithic integrated circuit.

17. A frequency converter as recited in claim 15 wherein said biasing means is operable for separately biasing said first and second transistors.

18. A frequency converter comprising:
mixing means for receiving an input signal and a local-oscillator signal and for generating an output signal containing the frequency products of the local-oscillator and input signals, wherein said mixing means includes first and second NPN transistors coupled as a Darlington pair, wherein the base of said first transistor is coupled to receive the input and local-oscillator signals and the common collectors of said transistors are coupled to generate the output signal, and wherein said mixing means further includes means for separately biasing said first and second transistors; and a feedback loop operable for supplying the local-oscillator signal to said mixing means, wherein said feedback loop includes a dielectric resonator that couples signals at the local-oscillator frequency from a microstrip line connected to said common collectors to another microstrip line connected to said base of said first transistor, and wherein the resonant frequency of said dielectric resonator determines the local-oscillator frequency of said frequency converter.

* * * * *